United States Patent
Mizushima

[11] Patent Number: 5,710,462
[45] Date of Patent: Jan. 20, 1998

[54] SEMICONDUCTOR INTEGRATED CIRCUIT DEVICE HAVING MULTI-LEVEL WIRING STRUCTURE WITHOUT DOT PATTERN

[75] Inventor: Kazuyuki Mizushima, Tokyo, Japan

[73] Assignee: NEC Corporation, Tokyo, Japan

[21] Appl. No.: 714,564

[22] Filed: Sep. 16, 1996

[30] Foreign Application Priority Data

Sep. 14, 1995  [JP]  Japan .................... 7-262454

[51] Int. Cl.⁶ .............. H01L 23/48; H01L 23/522; H01L 29/40
[52] U.S. Cl. .............. 257/758; 257/700; 257/774; 257/637
[58] Field of Search .............. 257/758, 637, 257/700, 745, 774

[56] References Cited

U.S. PATENT DOCUMENTS

| | | |
|---|---|---|
| 5,034,799 | 7/1991 | Tomita et al. ............ 257/758 |
| 5,446,311 | 8/1995 | Ewen et al. ............ 257/758 |
| 5,471,093 | 11/1995 | Cheung ............ 257/758 |
| 5,500,558 | 3/1996 | Hayashide ............ 257/758 |
| 5,517,060 | 5/1996 | Kobayashi ............ 257/758 |
| 5,525,827 | 6/1996 | Norman ............ 257/758 |
| 5,548,159 | 8/1996 | Jeng ............ 257/758 |
| 5,554,864 | 9/1996 | Koyama ............ 257/758 |

FOREIGN PATENT DOCUMENTS

| | | | |
|---|---|---|---|
| 0129476 | 12/1984 | European Pat. Off. ............ 257/758 |
| 3-274764 | 12/1991 | Japan ............ 257/758 |

*Primary Examiner*—Sara W. Crane
*Assistant Examiner*—Alexander Oscar Williams

[57] ABSTRACT

First plugs project from a lower inter-level insulating layer so as to be coplanar with an upper surface of a middle-level wiring on the lower-level insulating layer, and through-holes are formed in an upper inter-level insulating layer over the middle-level wiring and the first plug without an over-etching, thereby allowing second plugs in the through-holes to be directly held in contact with the middle-level wiring and the first plug.

3 Claims, 8 Drawing Sheets

SEMICONDUCTOR INTEGRATED CIRCUIT DEVICE HAVING MULTI-LEVEL WIRING STRUCTURE WITHOUT DOT PATTERN

FIELD OF THE INVENTION

This invention relates to a semiconductor integrated circuit device and a process of fabrication thereof and, more particularly, to a semiconductor integrated circuit device having a multi-level wiring structure and a process of fabrication thereof.

DESCRIPTION OF THE RELATED ART

The integration density of the semiconductor integrated circuit device has been progressively increased, and, accordingly, a large number of circuit components are connected through signal wirings. The large number of circuit components make the signal wirings complicated. However, it is impossible to assign wide real estate to the signal wirings, and a multi-level wiring structure is formed over a semiconductor substrate.

When more than two stories are incorporated the multi-level wiring structure, an upper wiring on the uppermost story may be connected through two stories to a lower signal wiring. In this instance, two vertical interconnections are required between the upper wiring and the lower signal wiring, and the upper signal wiring and the lower wiring are electrically connected through the two vertical interconnections. Such a two-stories interconnection is hereinbelow referred to as "laminated interconnection". The laminated interconnection enhances the design flexibility for signal paths, and is incorporated in the semiconductor integrated circuit device.

FIGS. 1A to 1C illustrate a typical example of a process of fabricating a laminated interconnection. The process starts with preparation of a semiconductor substrate 1. A field oxide layer is selectively grown on a major surface of the semiconductor substrate 1, and circuit components such as field effect transistors are formed on the active areas defined by the field oxide layer. Insulating substance is deposited over the entire surface of the structure, and the circuit components and the field oxide layer are covered with the insulating substance. The field oxide layer and the insulating substance form a lower insulating layer 2.

Conductive substance is deposited over the entire surface of the lower insulating layer 2, and the conductive layer is patterned into lower wirings 3a and 3b. Insulating substance is deposited over the entire surface of the structure by using a plasma-assisted chemical vapor deposition, and the lower wirings 3a and 3b are covered with a first inter-level insulating layer 4.

Photo-resist solution is spread over the first inter-level insulating layer 4, and the first inter-level insulating layer 4 is overlain by a photo-resist layer. A pattern image is optically transferred to the photo-resist layer, and is developed so as to form a photo-resist etching mask (not shown) on the first inter-level insulating layer 4. The photo-resist etching mask exposes parts of the first inter-level insulating layer 4 over the lower wirings 3a/3b to etchant, and lower through-holes 4a/4b are formed in the first inter-level insulating layer 4. The lower through-holes 4a/4b reach the upper surfaces of the lower wirings 3a/3b, respectively, and the lower wirings 3a/3b are exposed to the lower through-holes 4a/4b, respectively.

Tungsten is deposited over the first inter-level insulating layer 4. The tungsten fills the lower through-holes 4a/4b, and swells into a tungsten layer (not shown). The tungsten layer is uniformly etched away without an etching mask, and tungsten plugs 5a and 5b are left in the lower through-holes 4a/4b, respectively, as shown in FIG. 1A.

Subsequently, conductive substance is deposited over the entire surface of the structure shown in FIG. 1A, and the first inter-level insulating layer 4 and the tungsten plugs 5a/5b are covered with a conductive layer. Photo-resist solution is spread over the conductive layer, and the conductive layer is overlain by a photo-resist layer. A pattern image is optically transferred to the photo-resist layer, and is developed so as to form a photo-resist etching mask (not shown) on the conductive layer. The photo-resist etching mask exposes parts of the conductive layer to etchant, and the conductive layer is patterned into a middle-level wiring 6a and a dot pattern 6b. The middle-level wiring 6a is held in contact with the tungsten plug 5a, and is electrically connected to the lower wiring 3a. The dot pattern 6b is slightly wider than the tungsten plug 5b, and is held in contact therewith. The resultant structure is illustrated in FIG. 1B.

Insulating substance is deposited over the middle-level wiring 6a and the dot pattern 6b by using the plasma-assisted chemical vapor deposition, and the middle-level wiring 6a and the dot pattern 6b are covered with a second inter-level insulating layer 7.

Photo-resist solution is spread over the second inter-level insulating layer 7, and the second inter-level insulating layer 7 is overlain by a photo-resist layer. A pattern image is optically transferred to the photo-resist layer, and is developed so as to form a photo-resist etching mask (not shown) on the second inter-level insulating layer 7. The photo-resist etching mask exposes parts of the second inter-level insulating layer 7 over the middle-level wiring 6a and the dot pattern 6b to etchant, and upper through-holes 7a/7b are formed in the second inter-level insulating layer 7. The upper through-holes 7a/7b reach the upper surface of the middle-level wiring 6a and the upper surface of the dot pattern 6b, respectively.

Tungsten is deposited over the second inter-level insulating layer 7. The tungsten fills the upper through-holes 7a/7b, and swells into a tungsten layer (not shown). The tungsten layer is uniformly etched away without an etching mask, and tungsten plugs 8a and 8b are left in the upper through-holes 7a/7b, respectively.

Subsequently, conductive substance is deposited over the entire surface of the structure, and the second inter-level insulating layer 7 and the tungsten plugs 8a/8b are covered with a conductive layer. Photo-resist solution is spread over the conductive layer, and the conductive layer is overlain by a photo-resist layer. A pattern image is optically transferred to the photo-resist layer, and is developed so as to form a photo-resist etching mask (not shown) on the conductive layer. The photo-resist etching mask exposes parts of the conductive layer to etchant, and the conductive layer is patterned into upper wirings 9a and 9b as shown in FIG. 1C.

The upper wiring 9a is connected through the tungsten plug 7a to the middle-level wiring 6a which in turn is connected through the tungsten plug 4a to the lower wiring 3a. The tungsten plug 8b, the dot pattern 6b and the tungsten plug 5b provide a signal path between the upper wiring 9b and the lower wiring 3b. Thus, the lower wirings 3a and 3b selectively extend on the second story and the third story, and the prior art multi-level wiring structure enhances the flexibility of the design work by virtue of the dot pattern 6b.

However, a problem is encountered in the prior art multi-level wiring structure in that the dog pattern 6b interferes with further development of the wiring arrangement. In detail, the dot pattern 6b is so small that the focus margin in the optical pattern transfer is smaller than that of the middle-level wiring 6a. In order to exactly transfer the pattern image for the dot pattern 6b to the photo-resist layer, the dot pattern 6b is designed to be wider than the middle-level wiring 6a. When the lower wirings connected to the upper wirings are increased, the dot pattern 6b occupies a substantial amount of area on the second story, and limits the increase of the middle-level wirings 6a.

Another problem due to the dot pattern 6b is low production yield. As described hereinbefore, the dot pattern is very small. This means that the part of the photo-resist etching mask for the dot pattern is also very small. The narrow contact area between the photo-resist etching mask and the conductive layer makes the adhesion therebetween weak, and the part of the photo-resist etching mask is liable to peel off in the etching. The missing part allows the etchant to remove the conductive substance, and the dot pattern 6b is not formed. Moreover, the piece of photo-resist tends to adhere to an area of the conductive layer to be etched away, and undesirable short-circuit takes place between the middle-level wirings, by way of example. This results in reduction of the production yield.

Thus, the dot pattern 6b interferes with the further development of the wiring arrangement, and is causative of a low production yield. However, even if the dot pattern 6b is simply removed from the prior art multi-level wiring structure, yet another problem is encountered in the modified multi-level wiring structure.

FIG. 2 illustrates the multi-level wiring structure without the dot pattern 6b. The wirings and the insulating layers of the multi-level wiring structure shown in FIG. 2 are labeled with the references designating the corresponding wirings and layers of the prior art multi-level wiring structure without description. Reference numeral 10 designates a photo-resist etching mask for the through-holes 7a and 7b, and the dot pattern 6b is removed.

While the second inter-level insulating layer 7 is being etched, the through-hole 7a becomes too wide to expose the middle-level wiring 6a only due to the over-etching. This is because of the fact that the etching is continued until the other through-hole 7b reaches the tungsten plug 5b deeper than the middle-level wiring 6a. The reaction product during the etching contaminates the surface of the middle-level wiring 6a, and deteriorates the contact between the middle-level wiring 6a and the tungsten plug 8a.

SUMMARY OF THE INVENTION

It is therefore an important object of the present invention to provide a semiconductor integrated circuit device a multi-level wiring structure of which allows a manufacturer to arrange wirings at high density without deterioration.

It is also an important object of the present invention to provide a process of forming a reliable laminated interconnection in a multi-level wiring structure without a dot pattern.

To accomplish the object, the present invention proposes to form conductive plugs projecting over an inter-level insulating layer so as to level the conductive plugs to wirings on the inter-level insulating layer.

In accordance with the present invention, there is provided a semiconductor integrated circuit comprising: at least one circuit component forming a part of an integrated circuit; and a multi-level wiring structure connected to the integrated circuit, and including lower-level conductive paths, a first inter-level insulating layer covering the lower-level conductive paths and having first through-holes reaching upper surfaces of the lower-level conductive paths, first conductive plugs filling the first through-holes so as to be held in contact with the upper surfaces of the lower-level conductive paths and projecting over the first inter-level insulating layer by a certain distance, at least one middle-level wiring connected to one of the first conductive plugs so as to form an upper surface substantially coplanar with the upper surface of the aforesaid one of the first conductive plugs, a second inter-level insulating layer covering the at least one middle-level wiring and the first conductive plugs and having at least one second through-hole reaching the upper surface of another of the first conductive plugs, at least one second conductive plug filling the aforesaid at least one second through-hole and held in contact with the upper surface of the aforesaid another of the first conductive plugs, and at least one upper-level wiring formed on the second inter-level insulating layer and held in contact with an upper surface of the aforesaid at least one second conductive plug.

In accordance with another aspect of the present invention, there is provided a process of fabricating a multi-level wiring structure, comprising the steps of: a) preparing a semiconductor substrate; b) forming lower-level conductive paths for the semiconductor substrate; c) covering the lower-level conductive paths with a primitive inter-level insulating layer thicker than a first inter-level insulating layer by at least a thickness of a middle-level wiring; d) forming first through-holes reaching upper surfaces of the lower-level conductive paths in the primitive inter-level insulating layer; e) filling the first through-holes with first conductive plugs held in contact with the upper surfaces of the lower-level conductive paths; f) uniformly etching the primitive inter-level insulating layer by at least the thickness of the middle-level wiring so as to project upper portions of the first conductive plugs over an upper surface of the first inter-level insulating layer; g) forming the middle-level wiring on the first inter-level insulating layer so as to be connected to one of the first conductive plugs in such a manner as to from an upper surface substantially coplanar with an upper surface of the aforesaid one of the first conductive plugs; h) covering the middle-level wiring and the first conductive plugs with a second inter-level insulating layer; i) forming second through-holes reaching an upper surface of the middle-level wiring and an upper surface of another of the first conductive plugs; j) filling the second through-holes with second conductive plugs held in contact with the upper surface of the middle-level wiring and the upper surface of the aforesaid another of the first conductive plugs; and k) forming upper-level wirings on the second inter-level insulating layer so as to be held in contact with the upper surfaces of the second conductive plugs.

The middle-level wiring may be connected through another second conductive plug to another upper-level wiring formed on the second inter-level insulating-layer.

BRIEF DESCRIPTION OF THE DRAWINGS

The features and advantages of the process according to the present invention will be more clearly understood from the following description taken in conjunction with the accompanying drawings in which.

DESCRIPTION OF THE PREFERRED EMBODIMENTS

First Embodiment

Figure 1A:
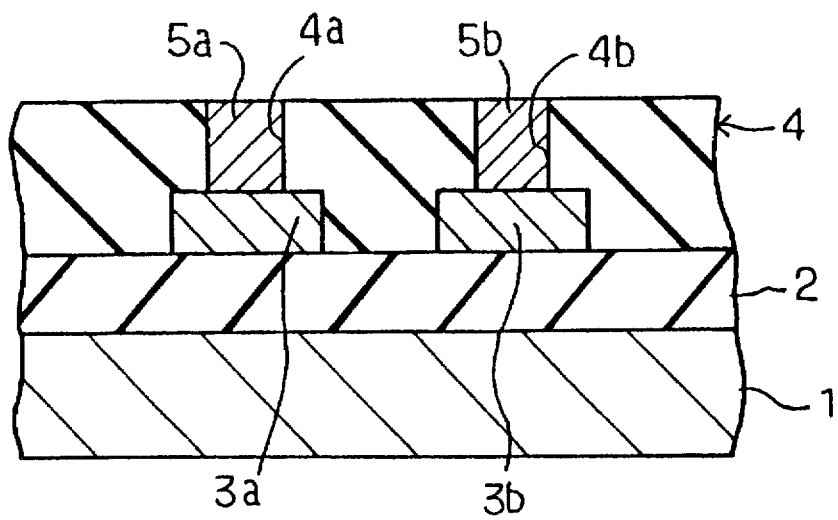
FIGS. 1A to 1C are cross sectional views showing the essential steps of the prior art process of fabricating a multi-level wiring structure.
Figure 1B:
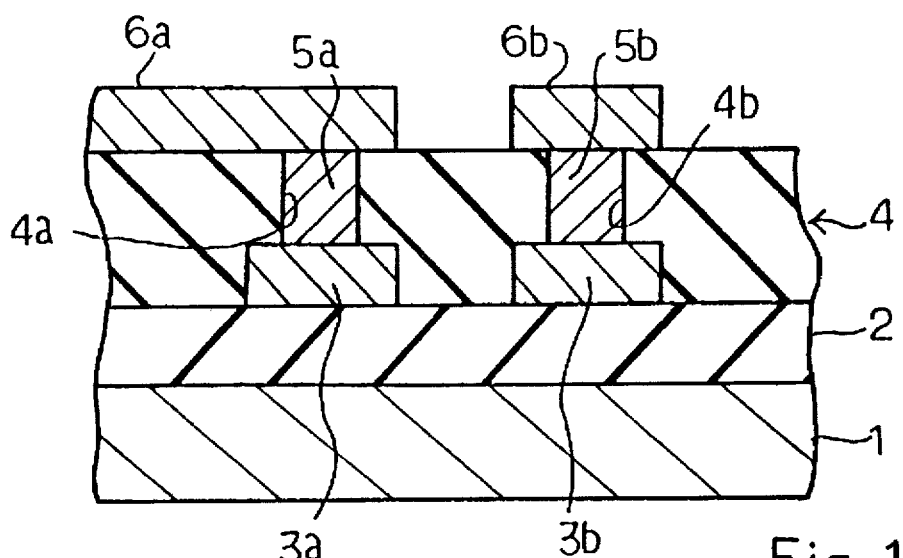
Figure 1C:
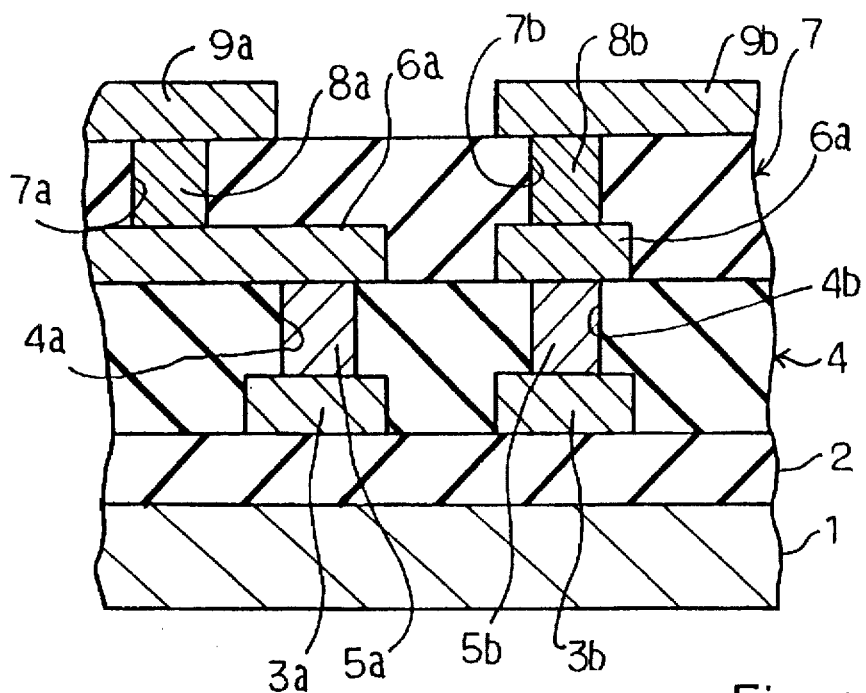
Figure 2:
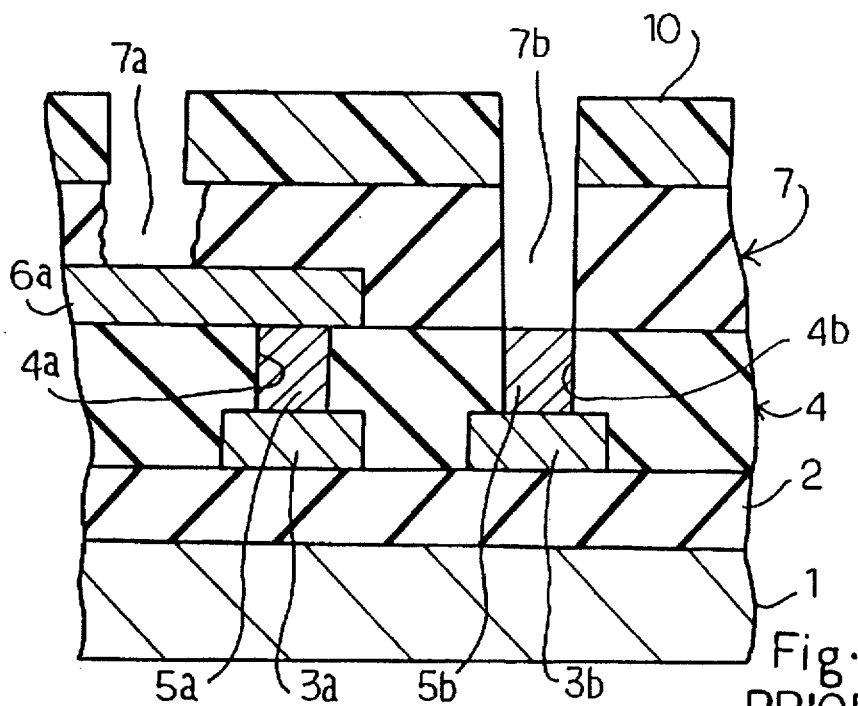
FIG. 2 is a cross sectional view showing the structure of the multi-level wiring structure modified from the prior art shown in FIG. 1C.

FIGS. 3A to 3H of the drawings illustrate a process of fabricating a semiconductor integrated circuit device embodying the present invention. The fabrication process starts with preparation of a semiconductor substrate 11 such as a p-type silicon substrate. A field oxide layer 12 is selectively grown on the major surface of the semiconductor substrate 11, and defines a plurality of active areas. The plurality of active areas are assigned to circuit components of the integrated circuit; however, FIGS. 3A to 3H show only one active area for the sake of simplicity.

One of the active areas is assigned to a field effect transistor 13, and the field effect transistor 13 is fabricated on the active area as follows. First, a gate oxide layer 13a is thermally grown, and a conductive layer is deposited on the entire surface of the structure. The conductive layer is patterned into a gate electrode 13b, and n-type dopnat impurity is lightly introduced into the active area in a self-aligned manner with the gate electrode 13b. Insulating material is deposited over the entire surface of the structure, and is anisotropically etched without an etching mask so as to form side wall spacers on both sides of the gate electrode 13b. N-type dopant impurity is heavily introduced into the active area in a self-aligned manner with the side wall spacers, and the heavily doped n-type regions are partially overlapped with the lightly doped n-type regions. The heavily doped n-type regions and the lightly doped n-type regions form n-type source and drain regions 13c and 13d. The gate insulating layer 13a, the gate electrode 13b and the n-type source and drain regions 13c and 13d as a whole constitute the field effect transistor 13.

Figure 3A:
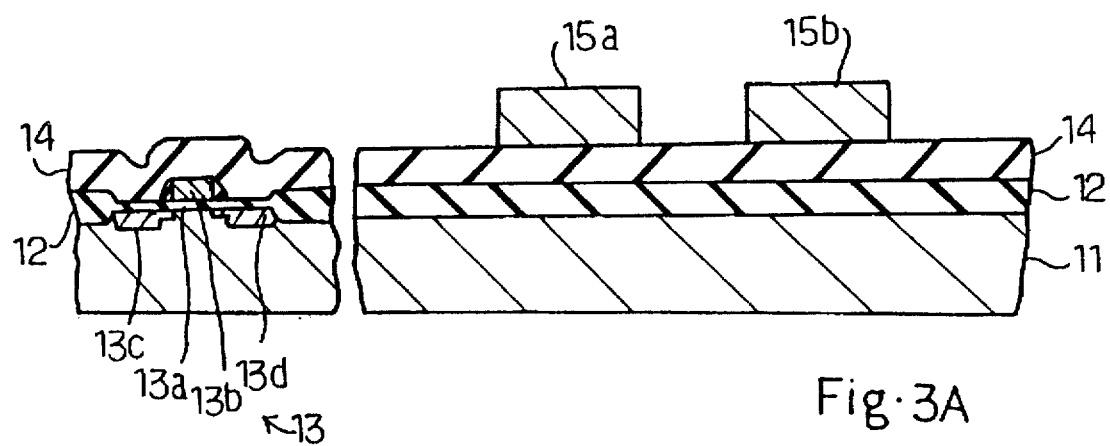
FIGS. 3A to 3H are cross sectional views showing a process sequence for fabricating a semiconductor integrated circuit device according to the present invention.

Subsequently, insulating material is deposited over the field effect transistor 13 and the field oxide layer 12, and forms a lower insulating layer 14. Subsequently, aluminum or aluminum alloy is deposited over the lower insulating layer 14, and forms an aluminum layer. Photo-resist is spread over the aluminum layer, and forms a photo-resist layer on the lower insulating layer 14. A pattern image for lower-level wirings is optically transferred to the photo-resist layer, and the photo-resist layer is developed into a photo-resist mask (not shown). The photo-resist etching mask selectively exposes the aluminum layer to etchant, and the aluminum layer is patterned into lower-level wirings 15a and 15b as shown in FIG. 3A. The lower-level wirings 15a and 15b are electrically connected to predetermined circuit components of the integrated circuit.

Subsequently, silicon oxide is deposited over the lower-level wirings 15a/15b and the lower insulating layer 14 by using a plasma-assisted chemical vapor deposition, and the lower-level wirings 15a/15b are covered with a primitive inter-level insulating layer 16. The primitive inter-level insulating layer 16 is thicker than a first inter-level insulating layer 16' by the thickness of a middle-level wiring. For example, if the first inter-level insulating layer 16' is 1 micron thick and the middle-level wiring is 0.5 micron thick, the primitive inter-level insulating layer 16 is deposited to 1.5 microns over the lower-level wirings 15a/15b.

Figure 3B:
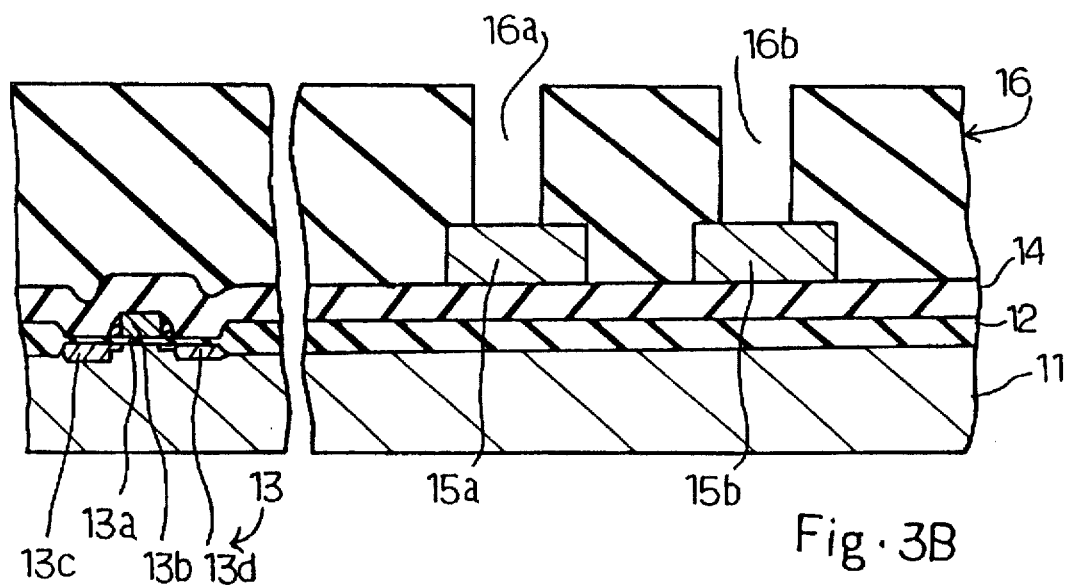

Subsequently, photo-resist is spread over the primitive inter-level insulating layer 16, and forms a photo-resist layer on the primitive inter-level insulating layer 16. A pattern image for through-holes is optically transferred to the photo-resist layer, and the photo-resist layer is developed into a photo-resist mask (not shown). The photo-resist etching mask selectively exposes the primitive inter-level insulating layer 16 to etchant, and through-holes 16a/16b are formed in the primitive inter-level insulating layer 16 as shown in FIG. 3B.

Subsequently, tungsten is deposited over the entire surface of the structure by using a selective chemical vapor deposition or a blanket chemical vapor deposition. The tungsten fills the through-holes 16a/16b, and swells into a tungsten layer on the primitive inter-level insulating layer 16. The tungsten layer is uniformly etched away without a mask until the primitive inter-level insulating layer 16 is exposed, again. As a result, tungsten plugs 17a and 17b are left in the through-holes 16a and 16b, respectively. Prior to the deposition of the tungsten, titanium nitride or a laminated layer of a titanium nitride film and a titanium may be topographically formed on the primitive inter-level insulating layer 16 and the upper surfaces of the lower-level wirings 15a/15b exposed to the through-holes 16a/16b.

Figure 3C:
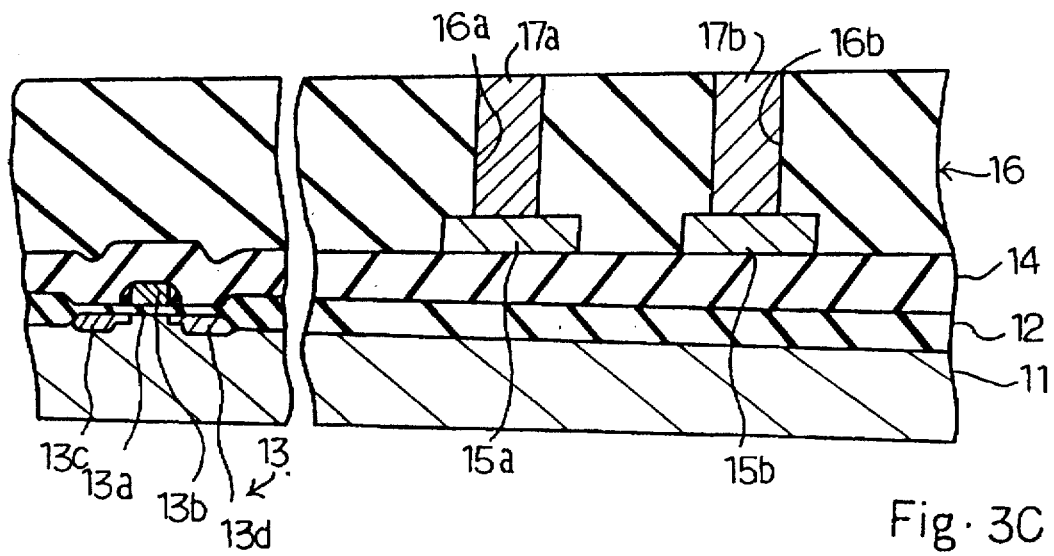

Subsequently, the resultant structure shown in FIG. 3C is exposed to etchant having a large selectivity to the silicon oxide rather than the tungsten without an etching mask, and the thickness of the primitive inter-level insulating layer 16 is decreased by the thickness of middle-level wiring. A reactive ion etching is available, and the etchant may contain $CF_4$ and $CHF_3$.

Figure 3D:
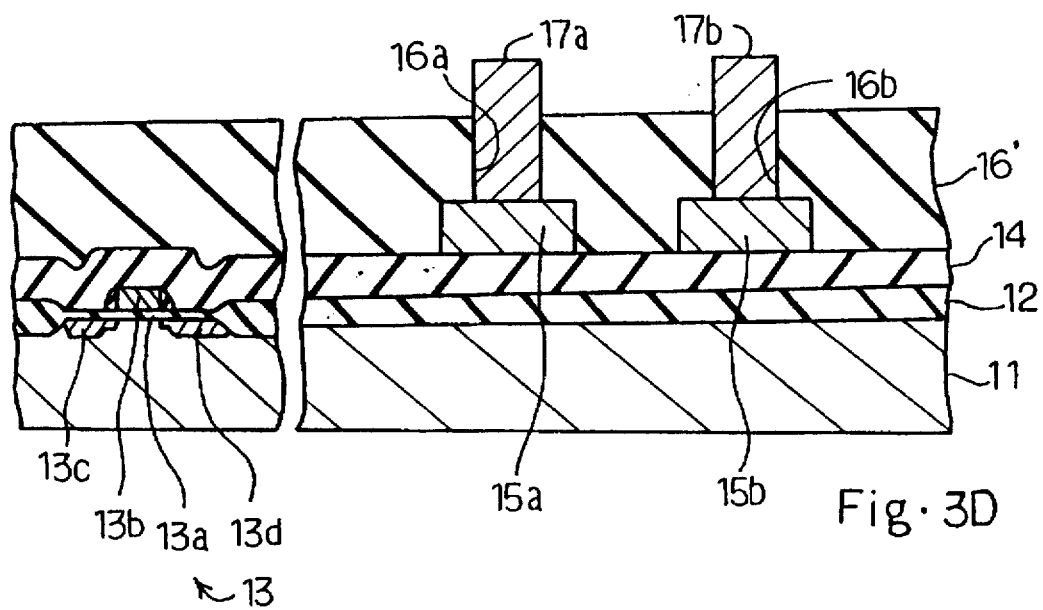

A first inter-level insulating layer 16' is formed from the primitive inter-level insulating layer 16, and, accordingly, the tungsten plugs 17a and 17b project from the first inter-level insulating layer 16' as shown in FIG. 3D. The height of the projections are approximately equal to the thickness of a middle-level wiring on the first inter-level insulating layer 16'.

Subsequently, aluminum or aluminum alloy is deposited over the first inter-level insulating layer 16' by using a sputtering at 450 degrees in centigrade. The high-temperature sputtering enhances the fluidity of the aluminum or aluminum alloy, and the aluminum or aluminum alloy creates a flat surface substantially coplanar with the top surfaces of the tungsten plugs 17a/17b. As a result, an aluminum layer 18 is spread over the first inter-level insulating layer 16'.

Figure 3E:
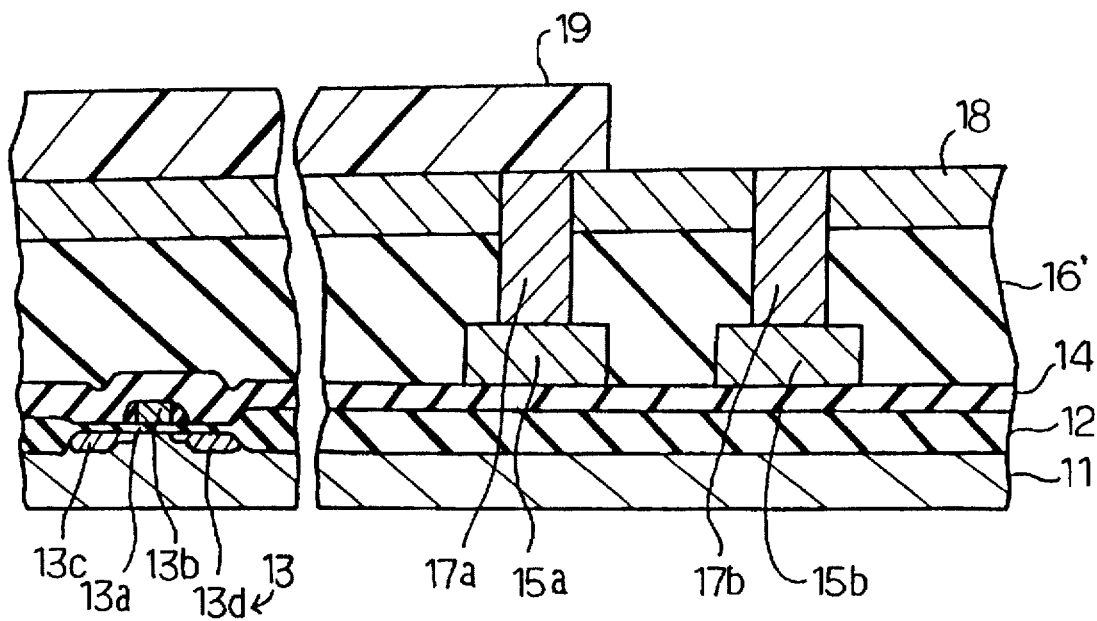

Photo-resist is spread over the entire surface of the aluminum layer 18, and is formed into a photo-resist layer. A pattern image for middle-level wirings is optically transferred to the photo-resist layer, and the photo-resist layer is formed into a photo-resist etching mask 19 through the development of the photo-resist layer. The photo-resist etching mask 19 only covers a part of the aluminum layer 18 used for middle-level wirings, but does not cover another part of the aluminum layer 18 around the tungsten plug 17b as shown in FIG. 3E.

Figure 3F:
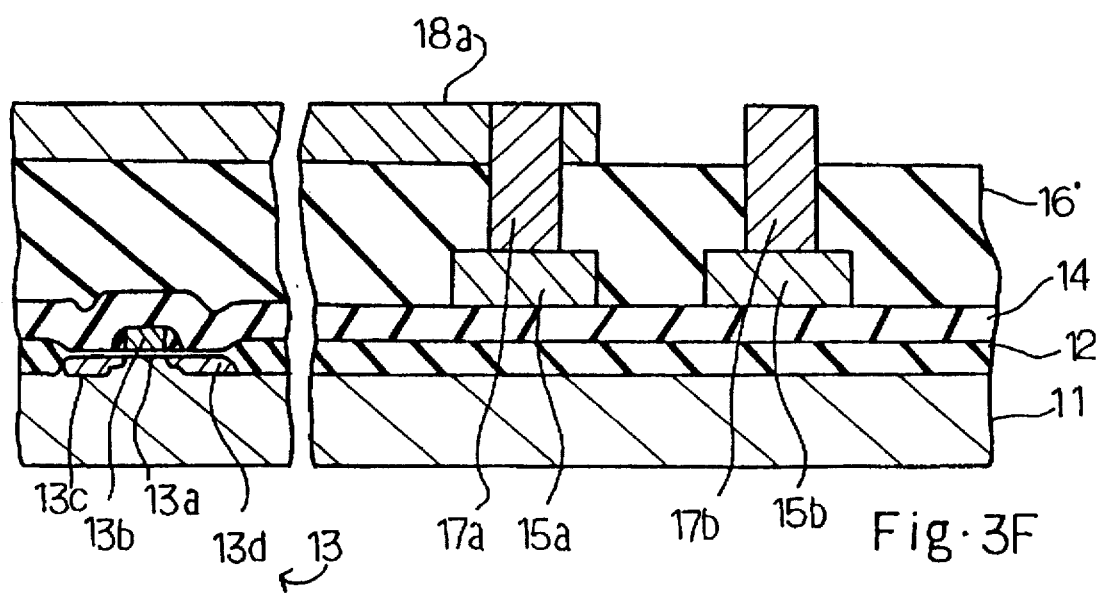

Using the photo-resist etching mask 19, the aluminum layer 18 is exposed to gaseous etchant such as $CCl_4$, $BCl_3$, $Cl_2$ or gaseous mixture thereof. The gaseous etchant has a large selectivity between the aluminum/aluminum alloy and the tungsten, and selectively removes the aluminum layer 18. As a result, middle-level wirings are left on the first inter-level insulating layer 16'. One of the middle-level wirings 18a is connected to the tungsten plug 17a, and the upper surface of the middle-level wiring 18a is coplanar with the tungsten plug 17a. The aluminum or aluminum alloy is removed around the other tungsten plug 17b, and the tungsten plug 17b is exposed to a space over the first inter-level insulating layer 16', again. the resultant structure is illustrated in FIG. 3F. Though not shown in FIG. 3F, the middle-level wiring 18a is electrically connected to one of the circuit components of the integrated circuit.

Subsequently, silicon oxide is deposited over the entire surface of the structure, and the middle-level wiring 18a and the tungsten plugs 17a/17b are covered with a second inter-level insulating layer 20 of the silicon oxide.

Photo-resist solution is spread over the second inter-level insulating layer 20, and forms a photo-resist layer. A pattern image for through-holes is optically transferred to the photo-resist layer, and a photo-resist etching mask 21 is formed from the photo-resist layer through the development.

Figure 3G:
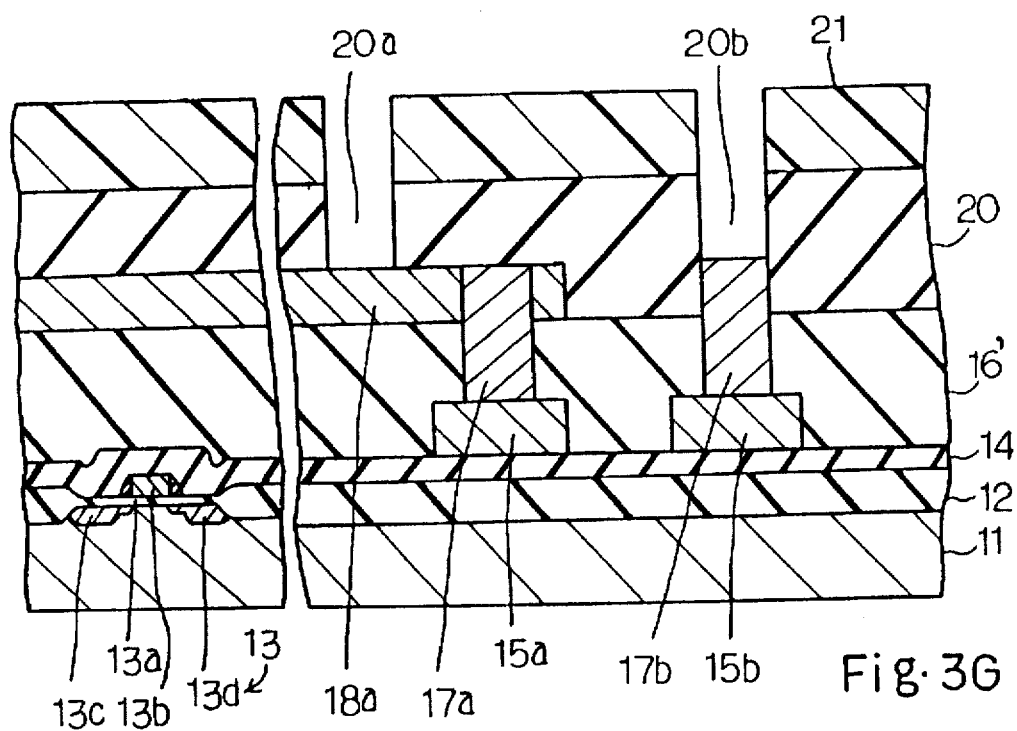

The photo-resist etching mask 21 exposes parts of the second inter-level insulating layer 20 to the gaseous etchant containing $CF_4$ and $CHF_3$ introduced into a reaction chamber of a reactive ion etching system, and through-holes 20a and 20b are formed in the second inter-level insulating layer 20. The upper surface of the middle-level wiring 18a is exposed to the through-hole 20a, and the upper surface of the tungsten plug 17b is exposed to the other through-hole 20b. The resultant structure is illustrated in FIG. 3G.

The reactive ion etching is terminated at the upper surface of the middle-level wiring 18a and the upper surface of the tungsten plug 17b, and the through-holes 20a and 20b are equal in depth. For this reason, no over-etching takes place, and undesirable reaction product is less than that of the prior art.

Subsequently, tungsten is deposited over the entire surface of the structure. The tungsten fills the through-holes 20a and 20b, and swells into a tungsten layer on the second inter-level insulating layer 20. A protective layer of titanium nitride or titanium nitride/titanium may be topographically formed along the surface of the second inter-level insulating layer 20 before the deposition of the tungsten.

The tungsten layer is uniformly etched away without an etching mask until the second inter-level insulating layer 20 is exposed, again. Tungsten plugs 22a and 22b are left in the through-holes 20a and 20b, respectively, and the tungsten plugs 17b and 22b form in combination a laminated interconnection according to the present invention.

Figure 3H:
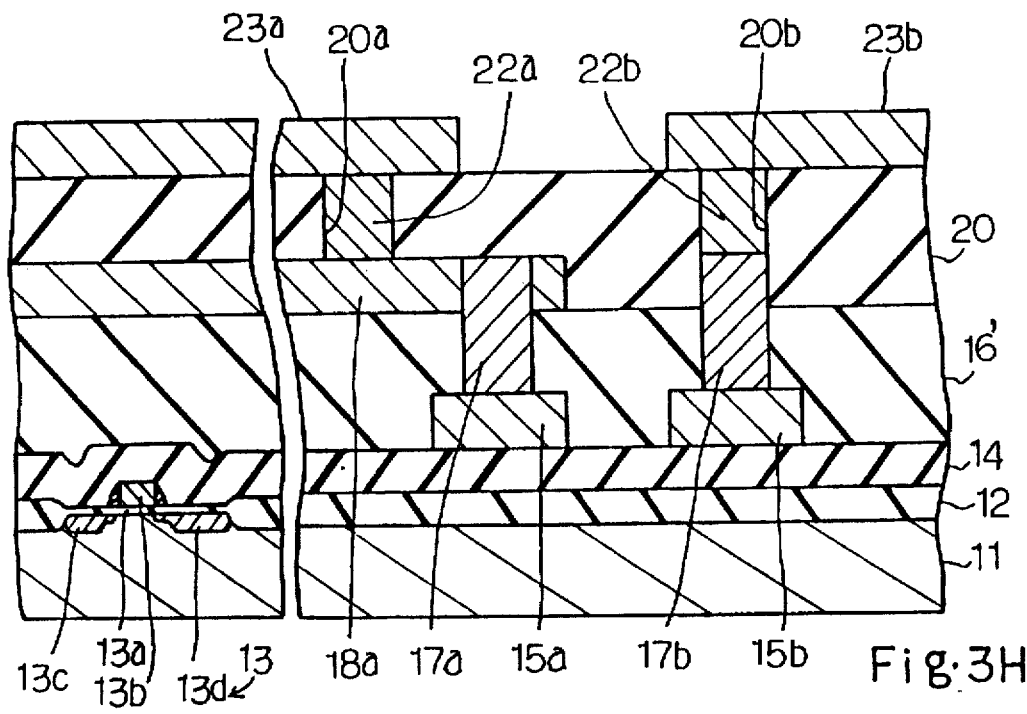

Subsequently, conductive substance is deposited over the entire surface of the structure. The conductive substance fills the through-holes 20a and 20b, and swells into a conductive layer. Photo-resist solution is spread over the conductive layer, and forms a photo-resist layer. A pattern image for upper-level wirings is optically transferred to the photo-resist layer, and a photo-resist etching mask is formed from the photo-resist layer through the development. Using the photo-resist etching mask, the conductive layer is selectively etched away so as to form upper-level wirings 23a and 23b as shown in FIG. 3H. The upper-level wirings 23a and 23b are held in contact with the tungsten plugs 22a and 22b, respectively, and are electrically connected to circuit components of the integrated circuit. The conductive substance may be aluminum or aluminum alloy. The upper-level wirings 23a and 23b are covered with a passivation layer, and the passivation layer completes the multi-level wiring structure.

In this instance, the lower-level wirings 15a and 15b serve as lower-level conductive paths, and first conductive plugs are implemented by tungsten plugs 17a and 17b, respectively. The tungsten plug 22b serves as at least one second conductive plug.

As will be appreciated from the foregoing description, a dot pattern wider than the tungsten plug 17b is not incorporated in the multi-level wiring structure, and the manufacturer can arrange a large number of middle-level wirings on the first inter-level insulating layer 16' at high density.

The photo-resist etching mask for the middle-level wirings is strongly adhered to the aluminum layer because of the wide contact area. The photo-resist does not partially peel off, and the photo-resist etching mask allows the etchant to exactly pattern the aluminum layer.

The middle-level wiring 18a is as high as the tungsten plug 17b, and the over-etching does not take place during the etching for the through-holes 20a/20b. For this reason, the production yield is enhanced, and, accordingly, the higher production yield reduces the production cost of the semiconductor integrated circuit device.

Second Embodiment

Figure 4A:
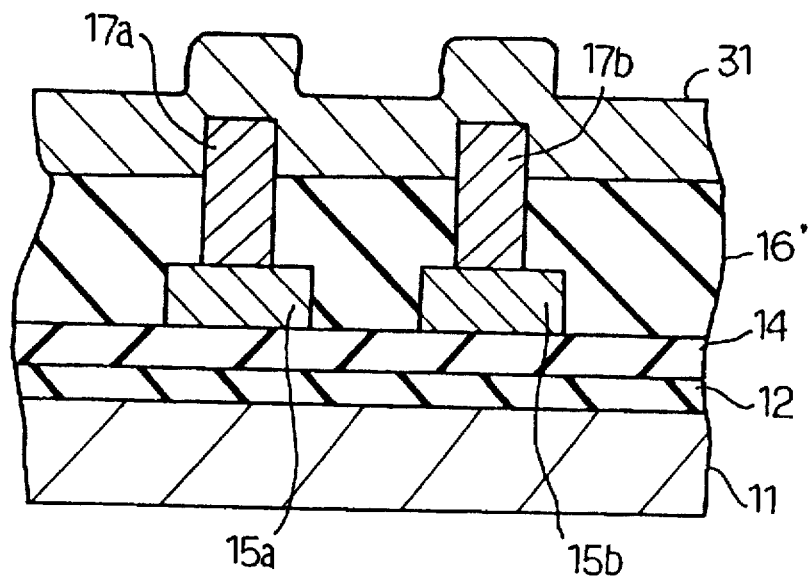
FIGS. 4A and 4B are cross sectional views showing essential steps of another process sequence according to the present invention.
Figure 4B:
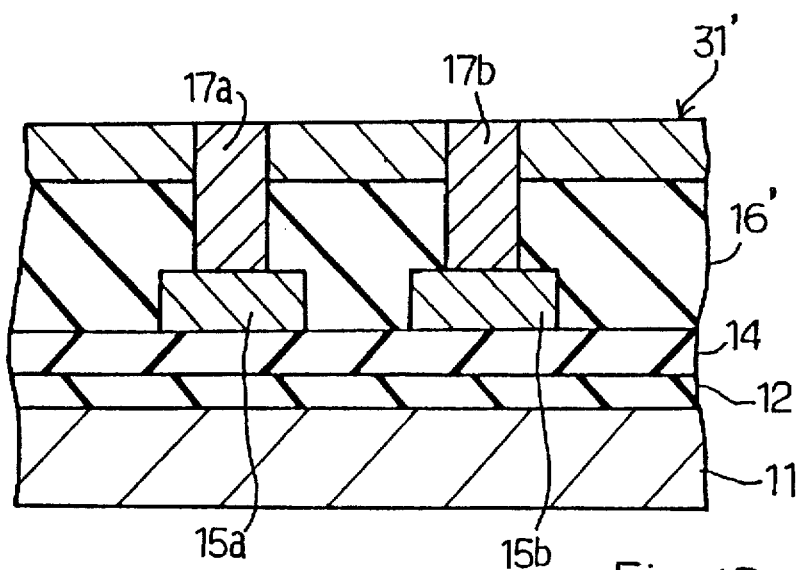

FIGS. 4A and 4B illustrate essential steps of another process of fabricating a semiconductor integrated circuit device embodying the present invention. The process implementing the second embodiment is similar to the first embodiment until the step of projecting the tungsten plugs 17a and 17b over the first inter-level insulating layer 16'. For this reason, a semiconductor substrate, a field insulating layer, a lower insulating layer, lower-level wirings, a first inter-level insulating layer and tungsten plugs are labeled with the references designating corresponding components of the first embodiment without detailed description.

When the primitive inter-level insulating layer 16 is uniformly etched back so as to project the upper portions of the tungsten plugs 17a/17b from the first inter-level insulating layer 16', conductive substance is deposited over the first inter-level insulating layer 16' by using a standard sputtering or a standard evaporation, and a conductive layer 31 topographically extends over the first inter-level insulating layer 16'. The conductive layer 31 partially protrudes over the tungsten plugs 17a and 17b as shown in FIG. 4A.

The conductive layer 31 is subjected to a mechanical polishing or a chemical mechanical polishing, and the mechanical polishing or the chemical/mechanical polishing creates a flat smooth surface. The flat upper surface of the conductive layer 31' is coplanar with the upper surfaces of the tungsten plugs 17a/17b as shown in FIG. 4B. Thus, the second embodiment does not require the high-temperature sputtering, and the circuit components of the integrated circuit are not affected by the heat during the high-temperature sputtering.

After the creation of the flat smooth surface, the process returns to the step of patterning the conductive layer shown in FIG. 3E, and the process proceeds through the steps described in conjunction with the first embodiment.

The second embodiment achieves all the advantages of the first embodiment. The mechanical polishing or the chemical mechanical polishing determines the thickness of the middle-level wiring and the height of the upper portions of the tungsten plugs 17a/17b. It is not necessary to exactly control the decrement of the primitive inter-level insulating layer and the thickness of the conductive layer deposited on the first inter-level insulating layer 16'. This means that the process of the second embodiment is superior in process controllability than the first embodiment. The good controllability enhances the production yield.

Although particular embodiments of the present invention have been shown and described, it will be obvious to those skilled in the art that various changes and modifications may be made without departing from the spirit and scope of the present invention.

For example, the present invention is applicable to more than three-level wiring structure, and plug is not limited to tungsten.

Figure 5:
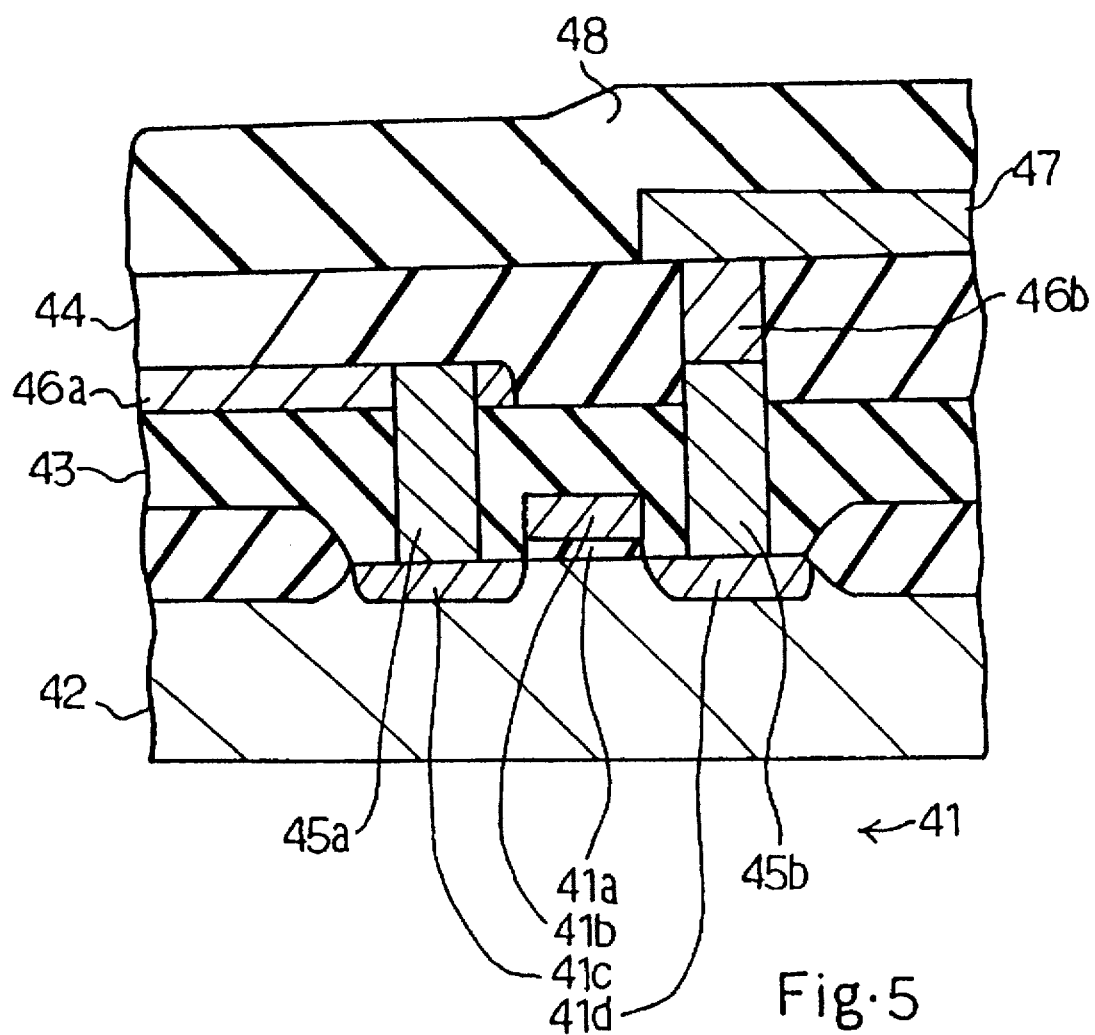
FIG. 5 is a cross sectional view showing the structure of a semiconductor integrated circuit device according to the present invention.

The laminated interconnection according to the present invention is available for an electrical connection between an impurity region and a wiring. FIG. 5 illustrates a semiconductor integrated circuit device according to the present invention. A field effect transistor 41 is fabricated on a p-type silicon substrate 42, and a gate insulating layer 41a, a gate electrode 41b, n-type source and drain regions 41c/41d form in combination the field effect transistor 41. First and second inter-level insulating layers 43 and 44 are laminated on the silicon substrate 42, and conductive plugs 45a and 45b are held in contact with the n-type source and drain regions 41c and 41d, respectively. The conductive plugs 45a and 45b partially project from the first inter-level insulating layer 43. A middle-level wiring 46a is connected to the conductive plug 45a, and another conductive plug 46b form a laminated interconnection together with the conductive plug 45b. The conductive plug 46b is held in contact with an upper-level wiring 47, and the laminated interconnection provides an electrical path between the n-type drain region 41d and the upper-level wiring 47. A passivation layer 48 covers the upper-level wiring 47. Thus, the laminated interconnection provides the electrical path between the n-type drain region 41d and the upper-level wiring 47.

What is claimed is:

1. A semiconductor integrated circuit comprising:

at least one circuit component forming a part of an integrated circuit; and a multi-level wiring structure connected to said integrated circuit, and including lower-level conductive paths, a first inter-level insulating layer covering said lower-level conductive paths and having first through-holes reaching upper surfaces of said lower-level conductive paths, first conductive plugs filling said first through-holes so as to be held in contact with said upper surfaces of said lower-level conductive paths and projecting over said first inter-level insulating layer by a certain distance, at least one middle-level wiring connected to one of said first conductive plugs so as to form an upper surface substantially coplanar with the upper surface of said one of said first conductive plugs, a second inter-level insulating layer covering said at least one middle-level wiring and said first conductive plugs so that said at least one second through-hole and said another of said first conductive plugs are aligned with each other and having at least one second through-hole reaching the upper surface of another of said first conductive plugs, at least one second conductive plug filling said at least one second through-hole and held in contact with said upper surface of said another of said first conductive plugs, and at least one upper-level wiring formed on said second inter-level insulating layer and held in contact with an upper surface of said at least one second conductive plug.

2. The semiconductor integrated circuit device as set forth in claim 1, in which said lower-level conductive paths are lower-level wirings formed on a lower insulating layer.

3. The semiconductor integrated circuit device as set forth in claim 1, in which said at least one middle-level wiring is connected to another upper-level wiring through another conductive plug formed in said second inter-level insulating layer.

* * * * *